United States Patent
Camacho et al.

(10) Patent No.: US 8,362,601 B2
(45) Date of Patent: Jan. 29, 2013

(54) WIRE-ON-LEAD PACKAGE SYSTEM HAVING LEADFINGERS POSITIONED BETWEEN PADDLE EXTENSIONS AND METHOD OF MANUFACTURE THEREOF

(75) Inventors: Zigmund Ramirez Camacho, Singapore (SG); Henry Descalzo Bathan, Singapore (SG); Jeffrey D. Punzalan, Singapore (SG); Lionel Chien Hui Tay, Singapore (SG)

(73) Assignee: Stats Chippac Ltd, Singapore (SG)

( * ) Notice: Subject to any disclaimer, the term of this patent is extended or adjusted under 35 U.S.C. 154(b) by 87 days.

(21) Appl. No.: 12/328,764

(22) Filed: Dec. 4, 2008

(65) Prior Publication Data

US 2010/0140764 A1   Jun. 10, 2010

(51) Int. Cl.
*H01L 21/60* (2006.01)
*H01L 23/495* (2006.01)

(52) U.S. Cl. ......... 257/676; 257/E21.506; 257/E23.031; 438/123

(58) Field of Classification Search .................. 257/676, 257/E21.506, E23.031; 438/123
See application file for complete search history.

(56) References Cited

U.S. PATENT DOCUMENTS

| | | | |
|---|---|---|---|
| 5,532,905 A * | 7/1996 | Moore | 361/723 |
| 5,767,566 A | 6/1998 | Suda | |
| 6,818,973 B1 * | 11/2004 | Foster | 257/676 |
| 6,995,459 B2 * | 2/2006 | Lee et al. | 257/676 |
| 7,129,569 B2 * | 10/2006 | Punzalan et al. | 257/676 |
| 2003/0127711 A1 | 7/2003 | Kawai et al. | |
| 2006/0192294 A1 * | 8/2006 | Lee | 257/778 |
| 2007/0170554 A1 * | 7/2007 | Camacho et al. | 257/666 |
| 2007/0170558 A1 * | 7/2007 | Camacho et al. | 257/676 |
| 2007/0212903 A1 | 9/2007 | Punzalan et al. | |
| 2007/0273043 A1 * | 11/2007 | Pendse et al. | 257/762 |
| 2008/0006929 A1 | 1/2008 | Punzalan et al. | |
| 2008/0229573 A1 * | 9/2008 | Wood et al. | 29/742 |
| 2009/0179335 A1 * | 7/2009 | Oh et al. | 257/783 |

* cited by examiner

*Primary Examiner* — Walter H Swanson
(74) *Attorney, Agent, or Firm* — Ishimaru & Associates LLP; Mikio Ishimaru; Stanley M. Chang (57) ABSTRACT

A method of manufacture of a wire-on-lead package system includes: providing a die attach paddle with paddle extensions distributed along the periphery of the die attach paddle, providing leadfingers surrounding the die attach paddle, attaching a semiconductor die to the die attach paddle wherein the semiconductor die is larger than the die attach paddle, and connecting bond wires between the semiconductor die and the leadfingers and between the semiconductor die and the paddle extensions.

20 Claims, 8 Drawing Sheets

WIRE-ON-LEAD PACKAGE SYSTEM HAVING LEADFINGERS POSITIONED BETWEEN PADDLE EXTENSIONS AND METHOD OF MANUFACTURE THEREOF

TECHNICAL FIELD

The present invention relates generally to semiconductor packaging technology, and more particularly to a leadframe package system with wire bonds on paddle extensions.

BACKGROUND ART

Micro devices and micro-circuits have come into use in a wide variety of consumer, commercial, industrial, and military devices and equipment. Micro-circuits, such as integrated circuits, contain a large number of active circuit elements, such as transistors, and passive elements, such as resistors and capacitors, fabricated on a substrate.

Semiconductor integrated circuits consist of small monolithic dies made of a semiconducting material, such as silicon, having discrete areas into which impurities are diffused to form circuit elements, and having conductive paths between circuit elements on the chip formed by conductive lines formed using diffused impurities or patterned metal layers. In hybrid micro-circuits, circuit elements mounted on a ceramic substrate are usually interconnected by conductive ink paths on the substrate.

Functional portions of integrated circuits are typically in the form of very small, rectangular-shaped semiconductor dies. Electrical connections to integrated circuit dies are often made by wire bonding.

Many conventional semiconductor die (or "chip") packages are of the type where a semiconductor die is molded into a package with a resin, such as an epoxy molding compound. The packages have leadfingers that project from the package body, to provide a path for signal transfer between the die and external devices. Other conventional package configurations have contact terminals or pads formed directly on the surface of the package.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability.

Conventional semiconductor packages are fabricated through the following processes: a die-bonding process (mounting the semiconductor die onto the paddle of a leadframe), a wire-bonding process (electrically connecting the semiconductor die on the paddle to inner leadfingers using bond wires), a molding process (encapsulating a predetermined portion of the assembly, containing the die, inner leadfingers and bond wires, with an epoxy resin to form a package body), and a singulation process (completing each assembly as individual, independent packages).

An exemplary semiconductor package, well known in the electronics industry, is the quad flat no-lead package ("QFN"). QFN packages typically comprise a leadframe, such as a conductive sheet stamped and etched, with a semiconductor die having a multitude of bond pads mounted to the top side of the leadframe. Wire bonds electrically connect the bond pads, of the semiconductor die, to a series of conductive leadfingers on the top side of the leadframe. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with increased number of input/output (I/O) in high volume. One such obstacle is being able to minimize the size of a leadless package in reference to a semiconductor die to be incorporated into the package.

Thus, a need still remains for leadframe package systems that can accommodate the largest possible semiconductor die without impacting the overall reliability of the package. In view of the ever-increasing commercial competitive pressures, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a wire-on-lead package system including: providing a die attach paddle with paddle extensions distributed along the periphery of the die attach paddle, providing leadfingers surrounding the die attach paddle, attaching a semiconductor die to the die attach paddle wherein the semiconductor die is larger than the die attach paddle, and connecting bond wires between the semiconductor die and the leadfingers and between the semiconductor die and the paddle extensions.

Furthermore, the present invention provides a wire-on-lead package system including: a die attach paddle with paddle extensions distributed along the periphery of the die attach paddle, leadfingers surrounding the die attach paddle, a semiconductor die attached to the die attach paddle wherein the semiconductor die is larger than the die attach paddle, and bond wires connecting the semiconductor die to the leadfingers and connecting the semiconductor die to the paddle extensions.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, the same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
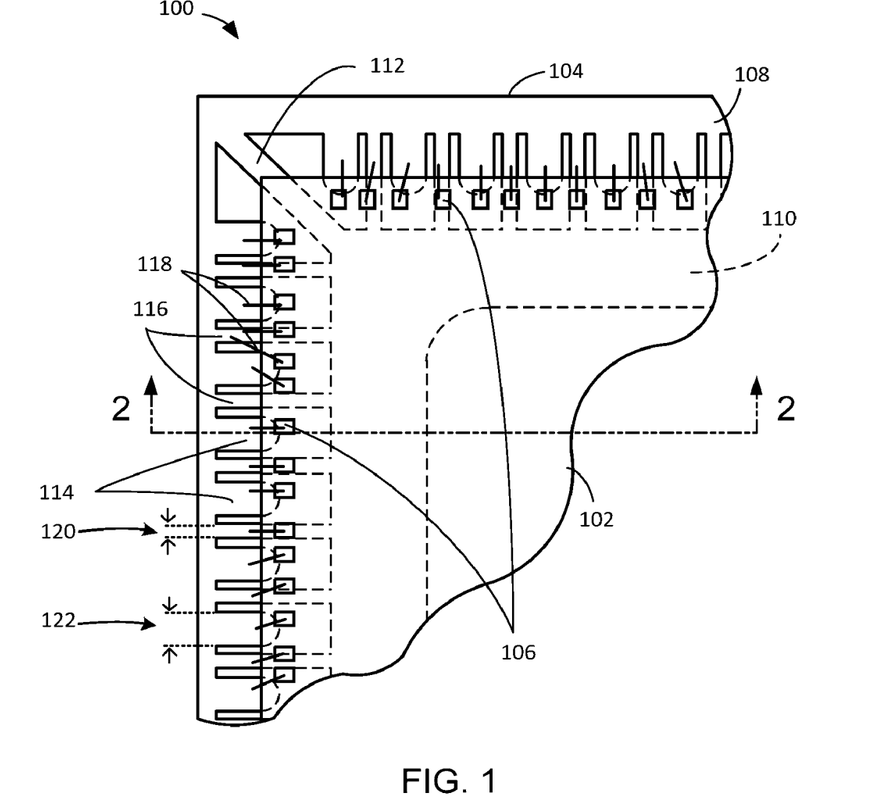
FIG. 1 is a top view of a wire-on-lead package system in a first embodiment of the present invention.

Referring now to FIG. 1, therein is shown a top view of a wire-on-lead package system 100 in a first embodiment of the present invention. The wire-on-lead package system 100 includes a semiconductor die 102 mounted over a leadframe 104. Layers covering at least portions of the leadframe 104 and the semiconductor die 102 are not shown for clarity.

The semiconductor die 102 contains components such as integrated circuits, optoelectronic devices, optical devices, sensors and actuators (for example, Micro Electro Mechanical Systems), or any combination thereof. For operation, the semiconductor die 102 requires at least power, ground, and input/output signals. Contact pads 106 provide electrical access to the components in the semiconductor die 102. Additional electrical connection points (not shown) may be available on the back surface of the semiconductor die 102.

The leadframe 104 is a structure defined by, for example, punching or etching a thin metal plate. Structural elements in the leadframe 104 include a frame 108 and a die attach paddle 110 supported from the frame 108 using a tie bar 112. Leadfingers 114 extend inward from the frame 108 toward the die attach paddle 110. Paddle extensions 116 extend outward from the die attach paddle 110 forming an integral bridge to the frame 108. In the embodiment of the invention shown in FIG. 1 the paddle extensions 116 are positioned between the leadfingers 114. The paddle extensions 116 have a paddle extension width 120. The leadfingers 114 have a maximum leadfinger width 122. The leadfingers 114 between two directly adjacent paddle extensions 116 have the maximum leadfinger width 122 greater than the paddle extensions width 120.

The leadfingers 114 are used to route power, ground, or input/output signals between the semiconductor die 102 and the next system level such as a circuit board (not shown). The leadfingers 114 are supported by the frame 108, but are not directly in contact with the die attach paddle 110 or with the semiconductor die 102. As a last step in the fabrication of the wire-on-lead package system 100, the frame 108 is separated from the rest of the leadframe 104, in a process termed "singulation," effectively isolating the leadfingers 114 from each other. The paddle extensions 116 are an integral element linking the frame 108 to the die attach paddle 110. The semiconductor die 102 is over a portion of the leadfingers 114 and a portion of the paddle extensions 116.

Bond wires 118 provide electrical connections between the contact pads 106 in the semiconductor die 102 and the leadfingers 114, and between the contact pads 106 and the paddle extensions 116. It has been discovered that the availability of the paddle extensions 116 enables for the semiconductor die 102 to be larger than the die attach paddle 110 while still providing an electrical connection to the die attach paddle 110 through the paddle extensions 116. Thus one of the primary advantages of the invention is that it enables maximizing the size of the semiconductor die 102 for a given size of the wire-on-lead package system 100.

It has been unexpectedly determined that the distributed arrangement of the paddle extensions 116 around the die attach paddle 110 provide several connection points distributed along the periphery of the semiconductor die. This arrangement of the paddle extensions 116 is enabling in cases where integrated circuits in the semiconductor die 102 require multiple connections to the die attach paddle 110 to provide grounding or a set bias. Moreover, the paddle extensions 116 and bonding methods employed in this invention minimize the pitch between the paddle extensions 116, thus maximizing the number of connection points to the die attach paddle 110. Thus, it has been discovered that the wire-on-lead package system 100 of the present invention furnishes important and heretofore unknown and unavailable solutions, capabilities, and functional aspects for packaging semiconductor dies that are larger than the die attach paddle 110 and that require multiple connection points to the die attach paddle 110 distributed along the periphery of the semiconductor die 102.

Figure 2:
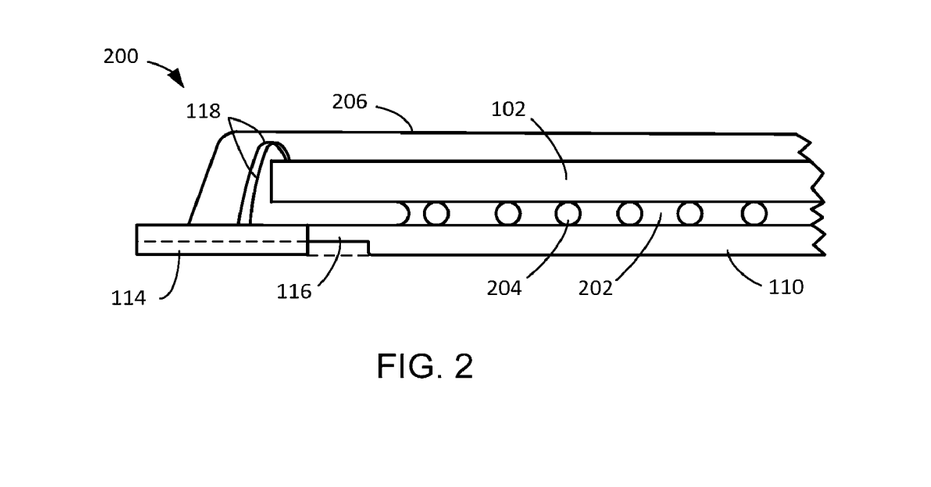
FIG. 2 is a side view of the wire-on-lead package system cut along line 2-2 shown in FIG. 1.

Referring now to FIG. 2, therein is shown a side view of the wire-on-lead package system 100 cut along line 2-2 shown in FIG. 1. The semiconductor die 102 is attached to the die attach paddle 110 using an adhesive 202. An electrical interconnect 204, such as a solder bump or ball, creates an electrical and mechanical connection between a body contact (not shown) or other contact areas (not shown) on the bottom surface of the semiconductor die 102 and the die attach paddle 110. The adhesive 202 encapsulates at least portions of the semiconductor die 102, the die attach paddle 110, and the electrical interconnect 204.

In an alternate embodiment of the invention, the adhesive 202 is a B-stage adhesive. A B-stage adhesive is defined as a thixotropic paste that can be applied to the backside of using convention screen or stencil printing equipment and is B-staged by, for example, exposing it to ultra-violet radiation. The B-staging stabilizes the adhesive for weeks prior to the bonding process with no loss in adhesion. In this embodiment of the invention, the adhesive 202 is applied to the backside of the semiconductor die 102 without using the electrical interconnect 204.

The paddle extensions 116 (partially shown in FIG. 2) are an extension of the die attach paddle 110, providing an electrical connection to the back surface of the semiconductor die 102. The contact pads 106 shown in FIG. 1 are connected to the leadfingers 114 or the paddle extensions 116 using the bond wires 118. As shown in FIG. 1 and FIG. 2, the semiconductor die 102 overhangs over the leadfingers 114 and the paddle extensions 116 without making direct contact with these elements.

An encapsulant 206 covers at least portions of the semiconductor die 102, the adhesive 202, the die attach paddle 110, the leadfingers 114, the paddle extensions 116, and the bond wires 118. The encapsulant 206 provides mechanical rigidity, electrical isolation, and protection from humidity for electrical elements in the wire-on-lead package system 100. Once the encapsulant 206 is formed, the frame 108 may be separated from the rest of the wire-on-lead package system 100.

Figure 3:
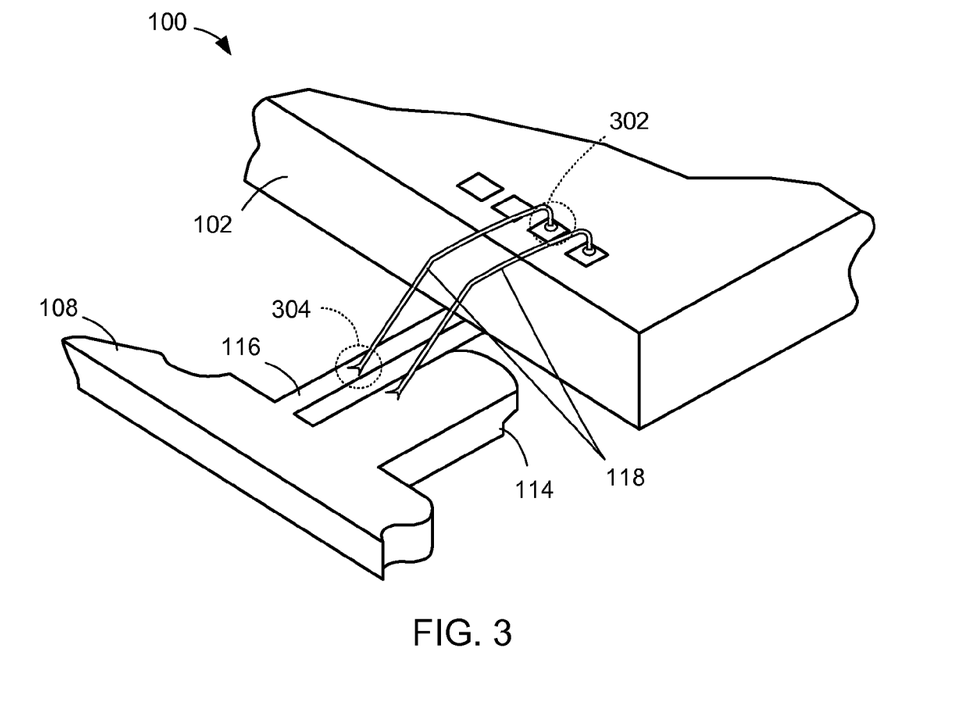
FIG. 3 is an isometric view of a portion of the wire-on-lead package system prior to encapsulation and singulation.

Referring now to FIG. 3, therein is shown an isometric view of a portion of the wire-on-lead package system 100 prior to encapsulation and singulation. The semiconductor die 102 overhangs over portions of the leadfingers 114 and the paddle extensions 116. Both the leadfingers 114 and the paddle extensions 116 are supported by the frame 108, which is removed following the encapsulation of the wire-on-lead package system 100.

In this embodiment of the invention, the bond wires 118 are formed by establishing a ball bond 302 at the end of the bond wire connected to the semiconductor die 102 and a wedge bond 304 on the leadfingers 114 or the paddle extensions 116.

Figure 4:
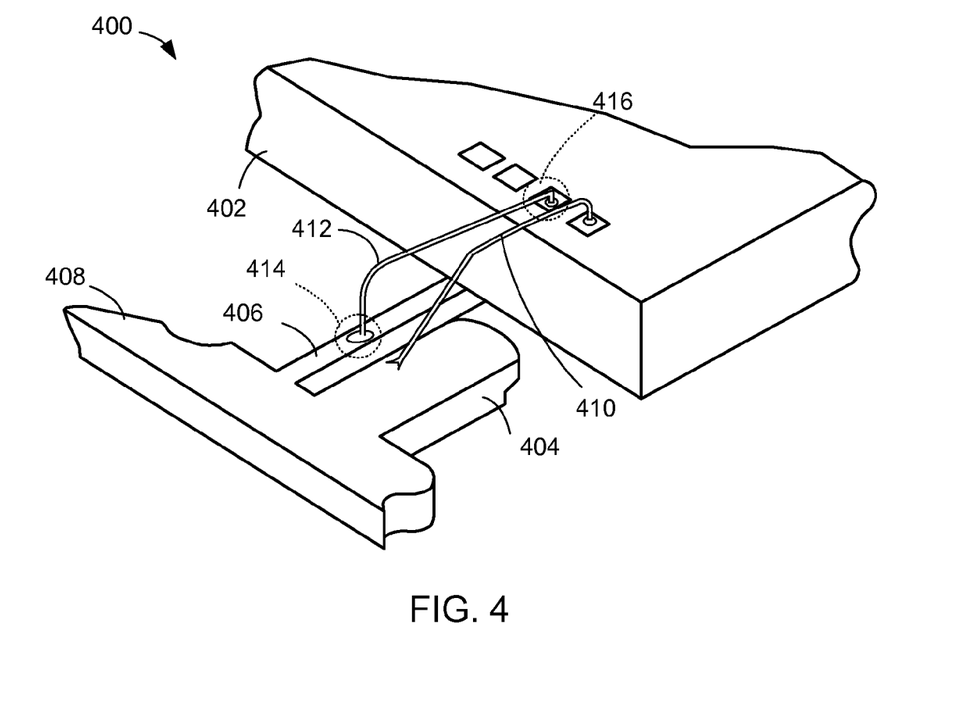
FIG. 4 is an isometric view of a portion of a wire-on-lead package system prior to encapsulation and singulation in a further embodiment of the present invention.

Referring now to FIG. 4, therein is shown an isometric view of a portion of a wire-on-lead package system 400 prior to encapsulation and singulation in a further embodiment of the present invention. A semiconductor die 402 overhangs over portions of leadfingers 404 and paddle extensions 406. Both the leadfingers 404 and the paddle extensions 406 are supported by a frame 408, which is removed following the encapsulation of the wire-on-lead package system 400.

In this embodiment of the invention, bond wires 410 connect the semiconductor die 402 to the leadfingers 404 and bond wires 412 connect the semiconductor die 402 to the paddle extensions 406. The bond wires 410 have the same configuration as the bond wires 118 used in the wire-on-lead package system 100 shown in FIG. 3.

The bond wires 412 are formed using a "Reverse Stand-Off Stitch Bond" (RSSB) scheme. The term "Reverse Stand-Off Stitch-Switch Bond" (RSSB) as used herein is defined as forming the bond wires 412 by establishing a ball bond 414 on the paddle extensions 406 and creating a stand-off stitch bond 416 on the semiconductor die 102. The stand-off stitch bond is formed by securing the wedge bond end of the bond wires 412 onto a previously formed ball bond.

Figure 5:
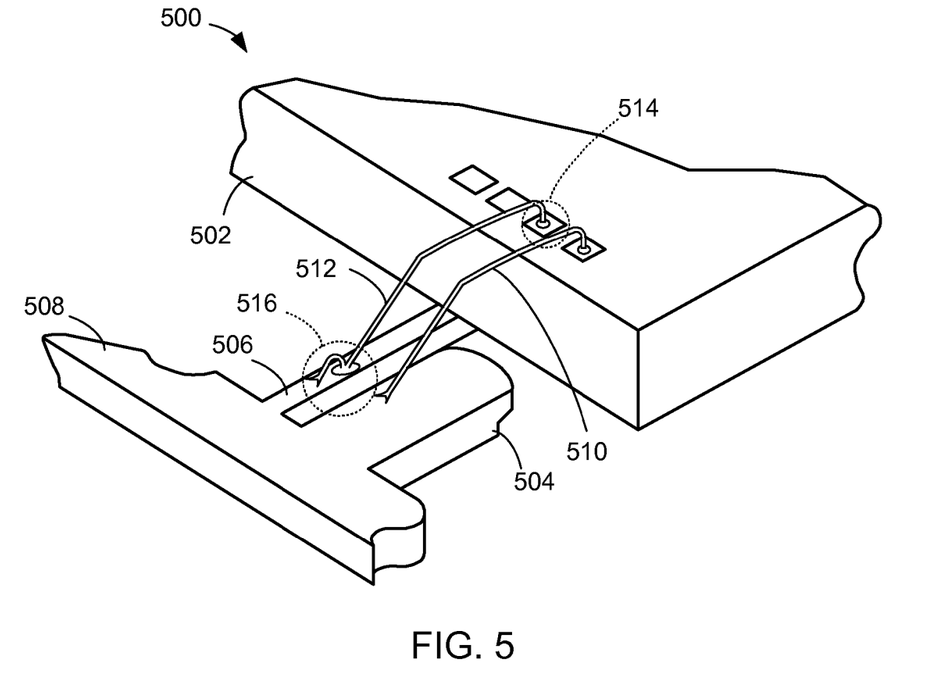
FIG. 5 is an isometric view of a portion of a wire-on-lead package system prior to encapsulation and singulation in a further embodiment of the present invention.

Referring now to FIG. 5, therein is shown an isometric view of a portion of a wire-on-lead package system 500 prior to encapsulation and singulation in a further embodiment of the present invention. A semiconductor die 502 overhangs over portions of leadfingers 504 and paddle extensions 506. Both the leadfingers 504 and the paddle extensions 506 are supported by a frame 508, which is removed following the encapsulation of the wire-on-lead package system 500.

In this embodiment of the invention, bond wires 510 connect the semiconductor die 502 to the leadfingers 504 and bond wires 512 connect the semiconductor die 502 to the paddle extensions 506. The bond wires 510 have the same configuration as the bond wires 118 used in the wire-on-lead package system 100 shown in FIG. 3.

The bond wires 512 are formed by establishing a ball bond 514 at the end of the bond wires 512 connected to the semiconductor die 502 and a security bond 516 on the paddle extensions 506. The term "security bond" as used herein is defined as a wedge bond with a ball bond of a second shorter bond wire applied onto it as shown in FIG. 5.

Figure 6:
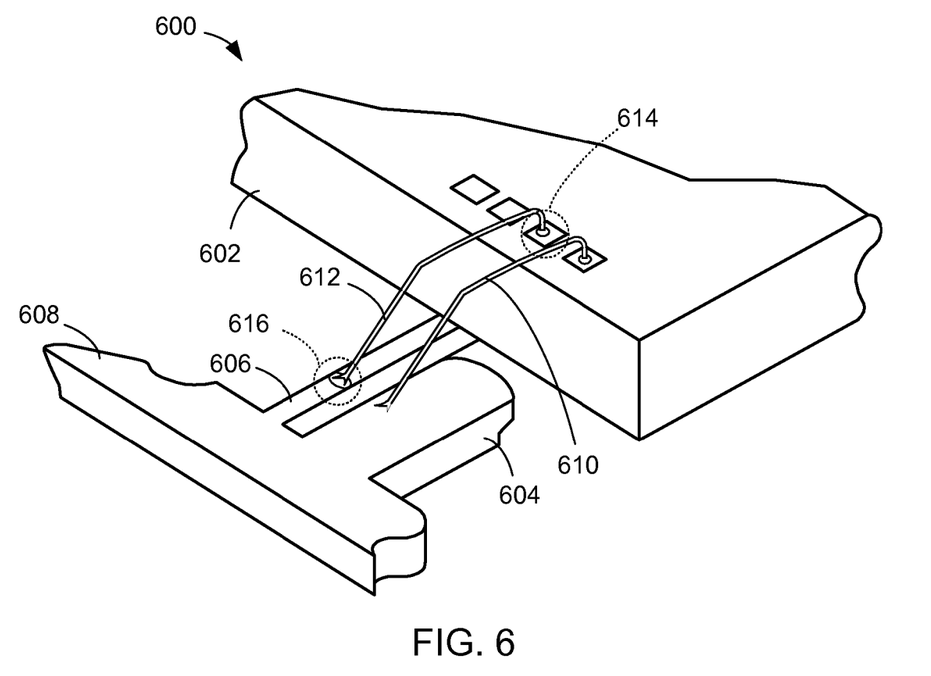
FIG. 6 is an isometric view of a portion of a wire-on-lead package system prior to encapsulation and singulation in a further embodiment of the present invention.

Referring now to FIG. 6, therein is shown an isometric view of a portion of a wire-on-lead package system 600 prior to encapsulation and singulation in a further embodiment of the present invention. A semiconductor die 602 overhangs over portions of leadfingers 604 and paddle extensions 606. Both the leadfingers 604 and the paddle extensions 606 are supported by a frame 608, which is removed following the encapsulation of the wire-on-lead package system 600.

In this embodiment of the invention, bond wires 610 connect the semiconductor die 602 to the leadfingers 604 and bond wires 612 connect the semiconductor die 602 to the paddle extensions 606. The bond wires 610 have the same configuration as the bond wires 118 used in the wire-on-lead package system 100 shown in FIG. 3.

The bond wires 612 are formed by establishing a ball bond 614 at the end of the bond wires 612 connecting onto the semiconductor die 602, and a stand-off stitch bond 616 on the paddle extensions 606. The stand-off stitch bond 616 is formed by applying a wedge bond onto a previously formed ball bond.

Figure 7:
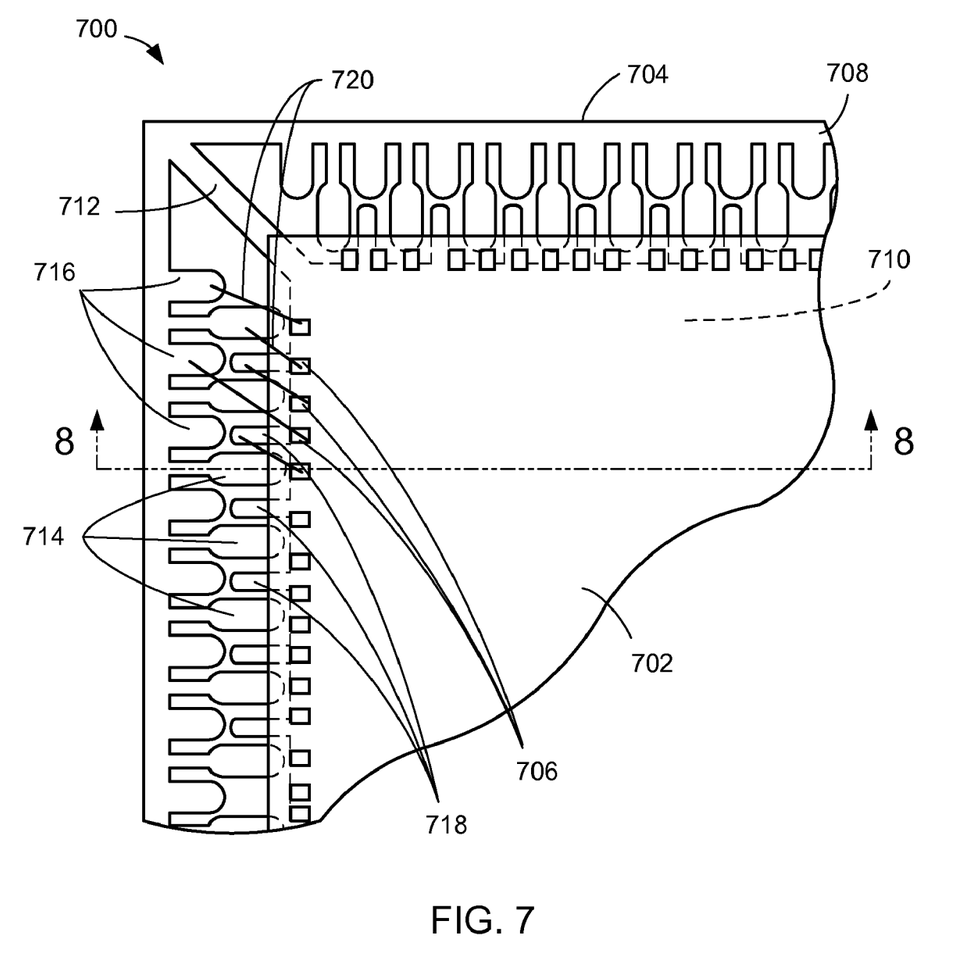
FIG. 7 is a top view of wire-on-lead package system in a further embodiment of the present invention.

Referring now to FIG. 7 therein is shown a top view of wire-on-lead package system 700 in a further embodiment of the present invention. The wire-on-lead package system 700 includes a semiconductor die 702 mounted over a leadframe 704. Layers covering at least portions of the leadframe 704 and the semiconductor die 702 are not shown for clarity.

The semiconductor die 702 contains contact pads 706 on its top surface, and a body contact (not shown) or additional electrical connection points (not shown) available on its back surface.

The leadframe 704 is a structure defined by, for example, punching or etching a thin metal plate. Structural elements in the leadframe 704 include a frame 708 and a die attach paddle 710 supported from the frame using a tie bar 712. Leadfingers 714 and short leadfingers 716 project from the frame 708 toward the die attach paddle 710. Paddle extensions 718 project from the die attach paddle 710 toward the frame 708. The paddle extensions 718 are arranged opposite to the short leadfingers 716.

The leadfingers 714 and the short leadfingers 716 are used to route power, ground, or input/output signals between the semiconductor die 702 and the next system level such as a circuit board (not shown). Both the leadfingers 714 and the short leadfingers 716 are supported by the frame 708, but are not directly in contact with the die attach paddle 710 or with the semiconductor die 702. As a last step in the fabrication of the wire-on-lead package system 700, the frame 708 is separated from the rest of the leadframe 704, in a process termed "singulation," effectively isolating the leadfingers 714 and the short leadfingers 716 from each other.

Bond wires 720 provide electrical connections between the contact pads 706 in the semiconductor die 702 and the leadfingers 714, the short leadfingers 716, or the paddle extensions 718. It has been discovered that the availability of the paddle extensions 718 enables for the semiconductor die 702 to be larger than the die attach paddle 710 while still providing an electrical connection to the die attach paddle 710 through the paddle extensions 718. Thus one of the primary advantages of the invention is that it enables maximizing the size of the semiconductor die 702 for a given size of the wire-on-lead package system 700.

It has been unexpectedly determined that the distributed arrangement of the paddle extensions 718 around the die attach paddle 710 provide several connection points distributed along the periphery of the semiconductor die. This arrangement of the paddle extensions 718 is enabling in cases where integrated circuits in the semiconductor die 702 require multiple connections to the die attach paddle 710 to provide grounding or a set bias to the integrated circuits. Moreover, the paddle extensions 718 and bonding methods employed in this invention minimize the pitch between the paddle extensions 718, thus maximizing the number of connection points to the die attach paddle 710.

Thus, it has been discovered that the wire-on-lead package system 700 of the present invention furnishes important and heretofore unknown and unavailable solutions, capabilities, and functional aspects for packaging semiconductor dies that are larger than the die attach paddle 710 and that require multiple connection points to the die attach paddle 710 distributed along the periphery of the semiconductor die 702.

Figure 8:
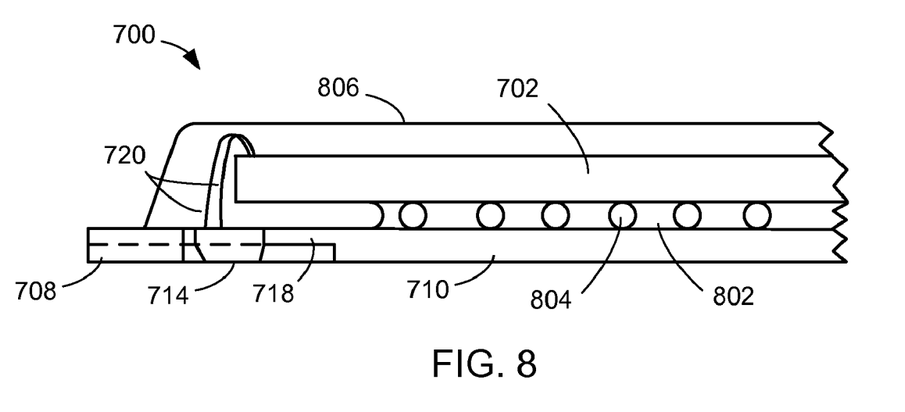
FIG. 8 is a side view of the wire-on-lead package system cut along line 8-8 shown in FIG. 7.

Referring now to FIG. 8, therein is shown a side view of the wire-on-lead package system 700 cut along line 8-8 shown in FIG. 7. The semiconductor die 702 is attached to the die attach paddle 710 using an adhesive 802. An electrical interconnect 804, such as a solder bump or ball, creates an electrical and mechanical connection between a body contact (not shown) or other contact areas (not shown) on the bottom surface of the semiconductor die 702 and the die attach paddle 710. The adhesive 802 encapsulates at least portions of the semiconductor die 702, the die attach paddle 710, and the interconnect 804.

The paddle extensions 718 (partially shown in FIG. 8) are an extension of the die attach paddle 710, providing an electrical connection to the semiconductor die 702. The contact pads 706 shown in FIG. 7 are connected to one of the leadfingers 714, the short leadfingers 716, or the paddle extensions 718 using the bond wires 720. As shown in FIG. 7 and FIG. 8, the semiconductor die 702 overhangs over the leadfingers 714 without making direct contact with these elements.

An encapsulant 806 covers at least portions of the semiconductor die 702, the adhesive 802, the die attach paddle 710, the leadfingers 714, the short leadfingers 716, the paddle extensions 718, and the bond wires 720. The encapsulant 806 provides mechanical rigidity, electrical isolation, and humidity protection for electrical elements in the wire-on-lead package system 700. Once the encapsulant 806 is formed, the frame 708 is separated from the rest of the wire-on-lead package system 700.

Figure 9:
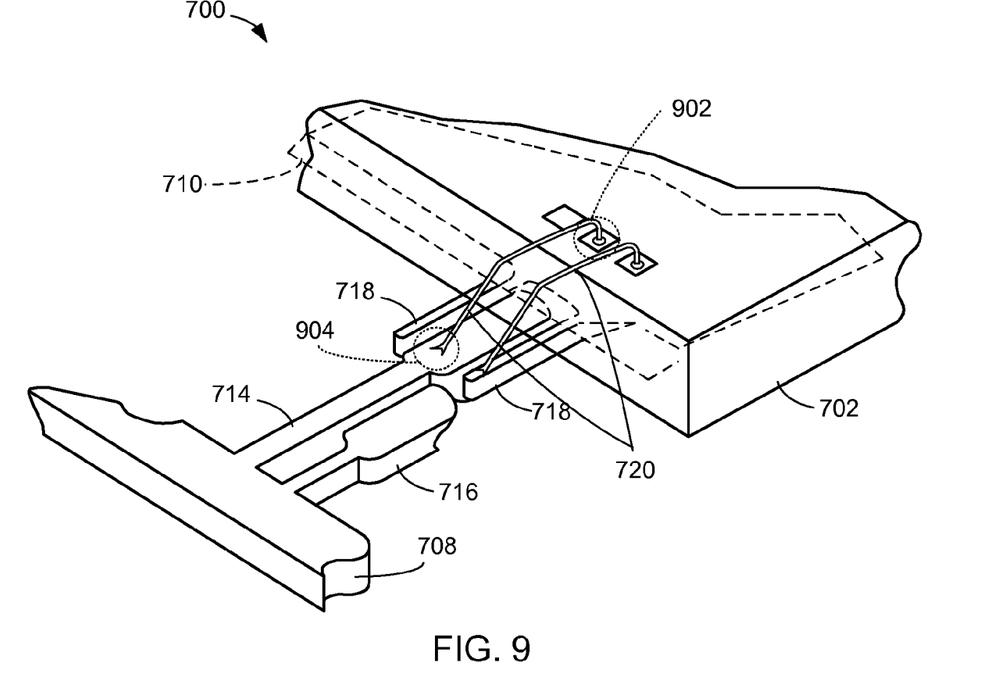
FIG. 9 is an isometric view of a portion of the wire-on-lead package system prior to encapsulation and singulation.

Referring now to FIG. 9, therein is shown an isometric view of a portion of the wire-on-lead package system 700 prior to encapsulation and singulation. The semiconductor die 702 overhangs over portions of the leadfingers 714 and the paddle extensions 718. Both the leadfingers 714 and the short leadfingers 716 are supported by the frame 708, which is removed following the encapsulation of the wire-on-lead package system 700.

In this embodiment of the invention, the bond wires 720 may be formed by establishing a ball bond 902 at the end of the bond wire connected to the semiconductor die 702 and a wedge bond 904 on the leadfingers 714, or the ground extensions 718, or the short leadfingers 716 (connection not shown in FIG. 9).

Figure 10:
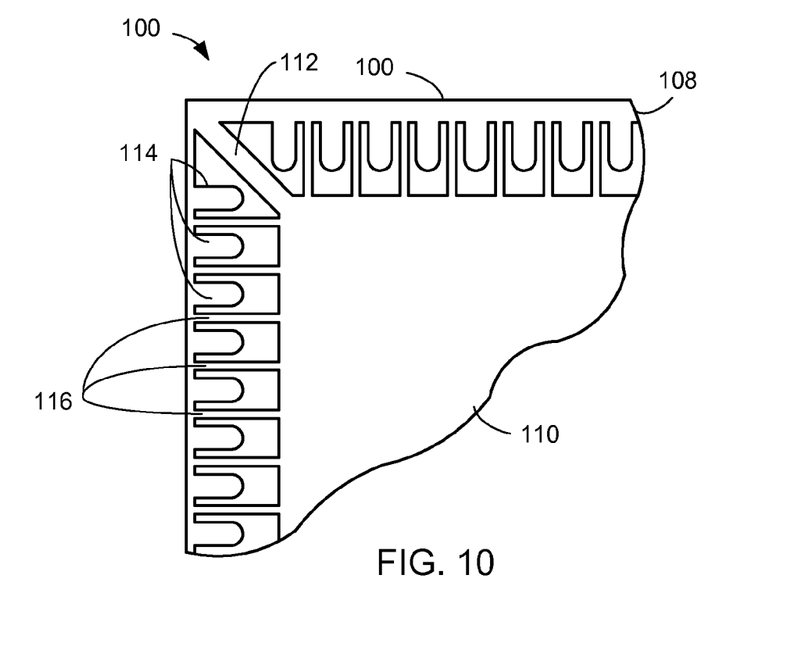
FIG. 10 is a top plan view of the leadframe in a first step of a method for manufacturing a wire-on-lead package system.

Referring now to FIG. 10, therein is shown a top plan view of the leadframe 104 in a first step of a method for manufacturing a wire-on-lead package system 100. The leadframe 104 is a structure defined by, for example, punching or etching a thin metal plate. Structural elements in the leadframe 104 include the frame 108 and the die attach paddle 110 supported from the frame using the tie bar 112. The leadfingers 114 and the paddle extensions 116 extend inward from the frame 108 toward the die attach paddle 110.

Figure 11:
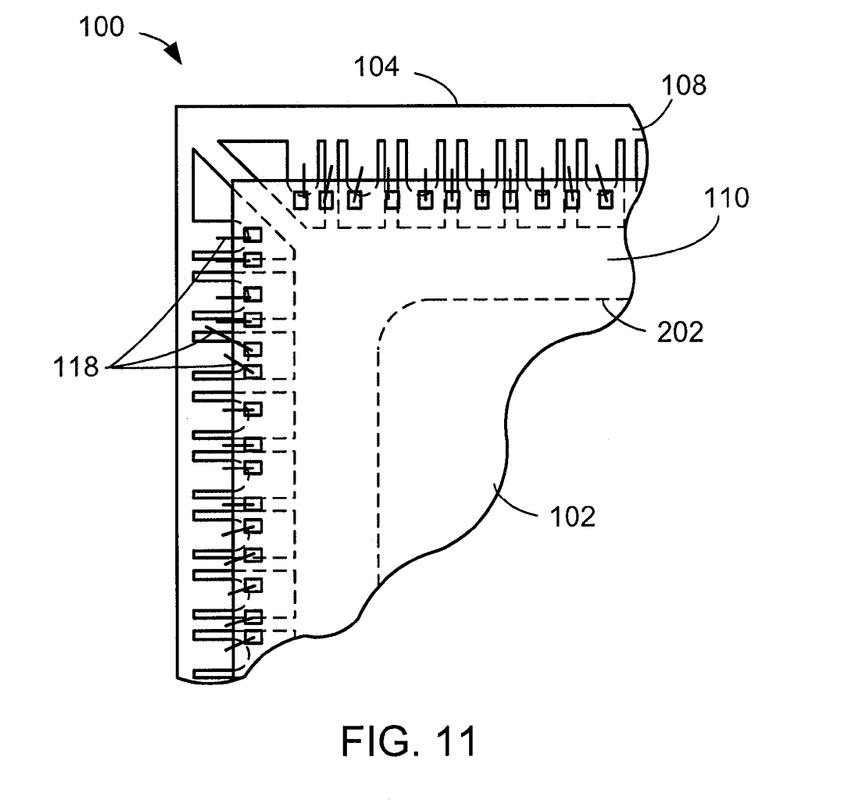
FIG. 11 is a top plan view of the structure shown in FIG. 10 following the attachment of the semiconductor die and the formation of the bond wires in steps of a method for manufacturing the wire-on-lead package system.

Referring now to FIG. 11, therein is shown a top plan view of the structure shown in FIG. 10 following the attachment of the semiconductor die 102 and the formation of the bond wires 118 in steps of a method for manufacturing the wire-on-lead package system 100. The semiconductor die 102 is attached to the die-attach paddle 110 using and adhesive 202 (in FIG. 11, the outline of the adhesive is shown as a hidden line). Following the die-attachment process, the semiconductor die 102 is connected to the leadfingers 114 or the paddle extensions 116 using the bond wires 118.

Figure 12:
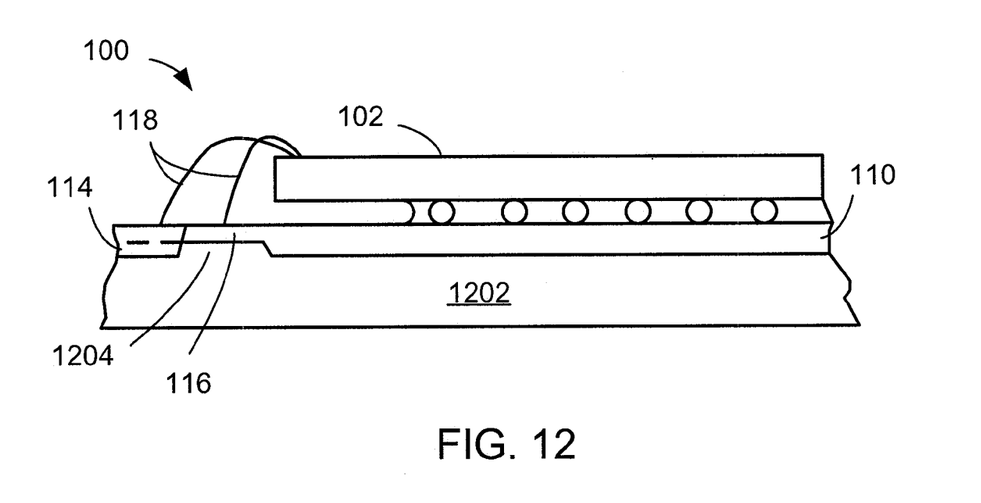
FIG. 12 is a cross-sectional side view of the structure of FIG. 11 during the wire bonding step of the method for manufacturing the wire-on-lead package system.

Referring now to FIG. 12, therein is shown a cross-sectional side view of the structure of FIG. 11 during the wire bonding step of the method for manufacturing the wire-on-lead package system 100. During the wire bonding step, a conformal wire-bond support 1202 provides mechanical support for the die attach paddle 110, the leadfingers 114, and the paddle extensions 116. The conformal wire-bond support 1202 includes feature protrusions 1204 for supporting elements such as the paddle extensions 116 during wire bonding.

Figure 13:
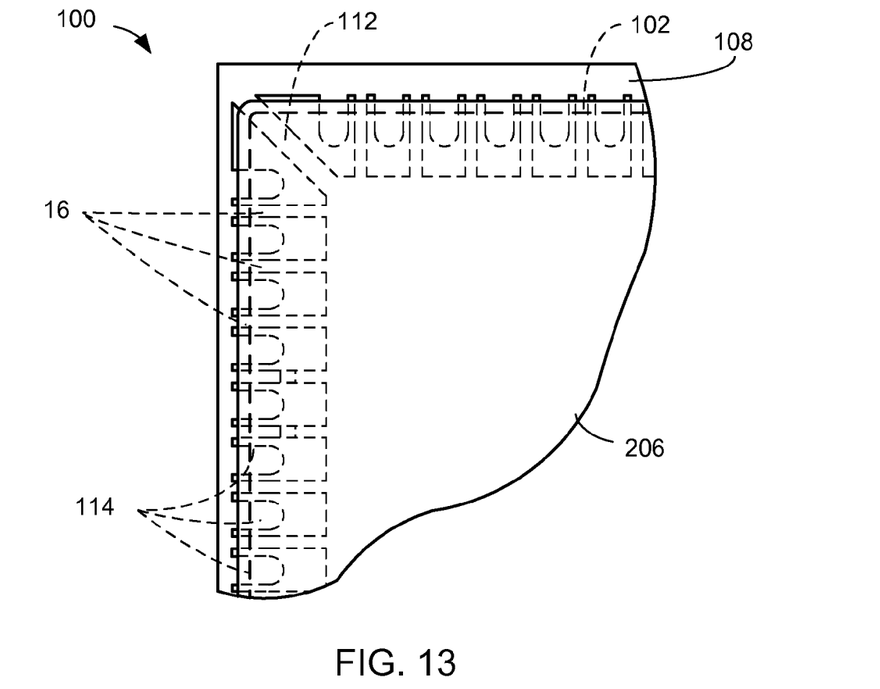
FIG. 13 is a top plan view of the structure shown in FIG. 11 following encapsulation of the wire-on-lead package system.

Referring now to FIG. 13, therein is shown a top plan view of the structure shown in FIG. 11 following encapsulation of the wire-on-lead package system 100. The encapsulant 206 is applied over at least portions of the semiconductor die 102, the tie bar 112, the leadfingers 114, the paddle extensions 116, and the bond wires 118 (shown in FIGS. 1, 2 and 12, for example). The frame 108 is not covered by the encapsulant 206. Hidden lines for the contact pads 106 and the bond wires 118 are not shown for clarity.

Figure 14:
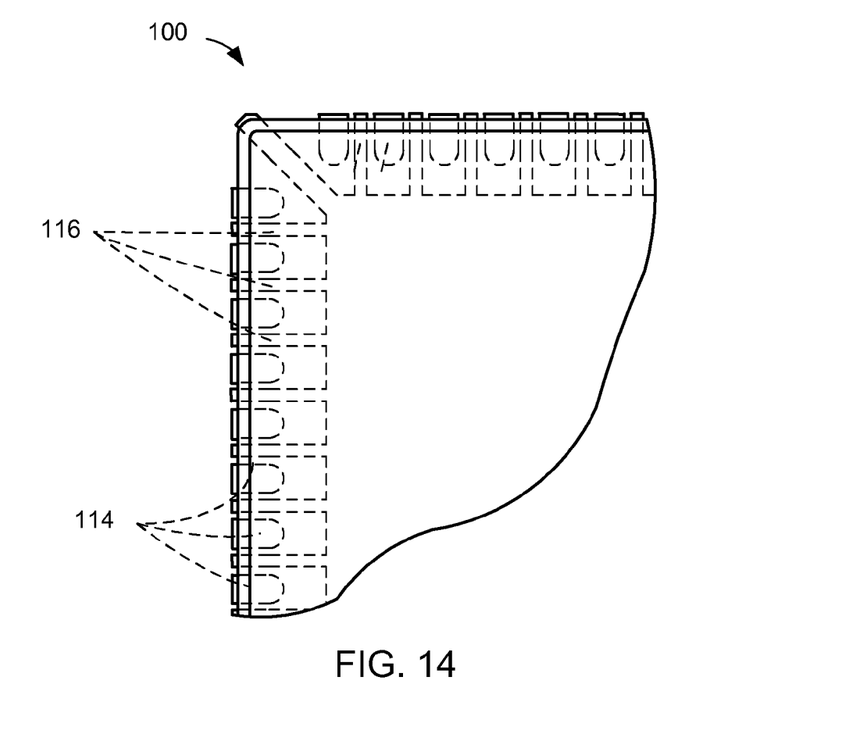
FIG. 14 a top plan view of the structure shown in FIG. 13 following singulation of the frame shown in FIG. 13.

Referring now to FIG. 14, therein is shown a top plan view of the structure shown in FIG. 13 following singulation of the frame 108 shown in FIG. 13. In this final step in the method for manufacturing the wire-on-lead package system 100, the frame 108 shown in FIG. 13 is separated from the leadfingers 114, the paddle extensions 116, and the tie bar 112. Hidden lines for the contact pads 106 and the bond wires 118 are not shown for clarity.

The wire-on-lead package system 100, thus manufactured, is then mounted to a circuit board by matching and soldering the leadfingers 114 or the paddle extensions 116 thereof to a matching pattern on a circuit board (not shown), to thereby enable power, ground, and signal input/output ("I/O") operations between the wire-on-lead package system 100 and the circuit board.

Figure 15:
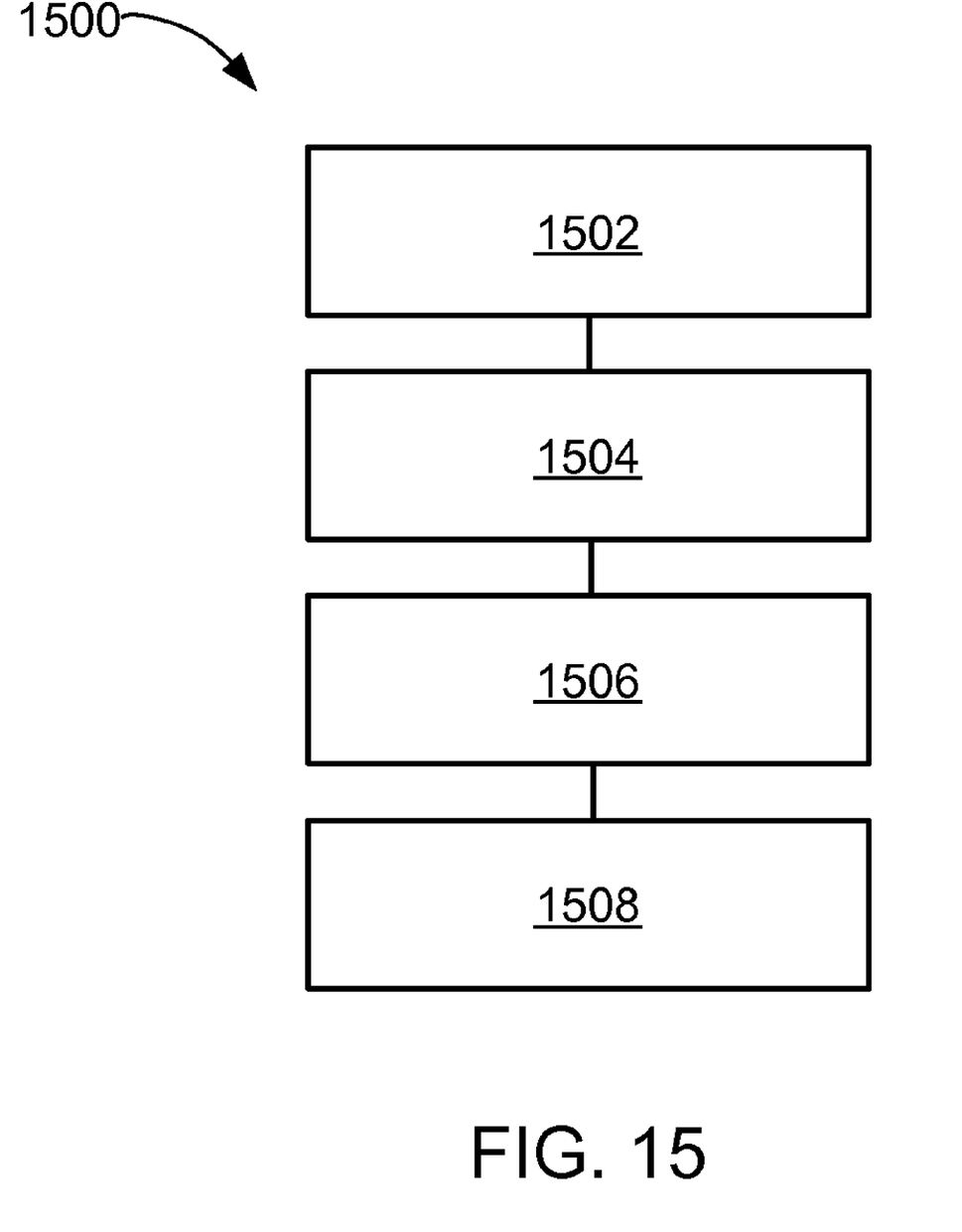
FIG. 15 is a flow chart of a method of manufacture of the wire-on-lead package system in an embodiment of the present invention.

Referring now to FIG. 15, therein is shown a flow chart of a method of manufacture of the wire-on-lead package system in an embodiment of the present invention. The method 1500 includes: providing a die attach paddle with paddle extensions distributed along the periphery of the die attach paddle in a block 1502, providing leadfingers surrounding the die attach paddle in a block 1504, attaching a semiconductor die to the die attach paddle wherein the semiconductor die is larger than the die attach paddle in a block 1506, and connecting bond wires between the semiconductor die and the leadfingers and between the semiconductor die and the paddle extensions in a block 1508.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A wire-on-lead package system comprising:
   a die attach paddle with paddle extensions having a paddle extension width and extending out from the die attach paddle and distributed along the periphery of the die attach paddle;
   leadfingers having a maximum leadfinger width and surrounding the die attach paddle and positioned between the paddle extensions wherein the leadfingers between two directly adjacent paddle extensions have the maximum leadfinger width greater than the paddle extension width;
   a semiconductor die attached to the die attach paddle wherein the semiconductor die is larger than the die attach paddle; and
   bond wires connecting the semiconductor die to the leadfingers and connecting the semiconductor die to the paddle extensions for providing an electrical connection to the die attach paddle.

2. The system as claimed in claim 1 wherein the bond wires connecting the semiconductor die and the leadfingers have a ball bond on the semiconductor die and a wedge bond on the leadfingers.

3. The system as claimed in claim 1 wherein the bond wires connecting the semiconductor die to the paddle extensions have a stand-off stitch bond on the semiconductor die.

4. The system as claimed in claim 1 wherein the bond wires connecting the semiconductor die to the paddle extensions have a security bond on the paddle extensions.

5. The system as claimed in claim 1 wherein the bond wires connecting the semiconductor die to the paddle extensions have a stand-off stitch bond on the paddle extensions.

6. The system as claimed in claim 1 further comprising an encapsulant encapsulating portions of the semiconductor die, the leadfingers, the paddle extensions, and the bond wires.

7. The system as claimed in claim 6 wherein the semiconductor die is over a portion of the leadfingers and a portion of the paddle extensions.

8. The system as claimed in claim 6 wherein the semiconductor die is attached to the die attach paddle using an adhesive and further comprising placing an electrical interconnect between the semiconductor die to the die attach paddle.

9. The system as claimed in claim 6 further comprising short leadfingers shorter than the leadfingers and bond wires connecting the semiconductor die to the short leadfingers.

10. The system as claimed in claim 6 further comprising short leadfingers shorter than the leadfingers and arranged opposite to the paddle extensions.

11. A method of manufacture of a wire-on-lead package system comprising:
    providing a die attach paddle with paddle extensions having a paddle extension width and extending out from the die attach paddle and distributed along the periphery of the die attach paddle;
    providing leadfingers having a maximum leadfinger width and surrounding the die attach paddle and positioned between the paddle extensions wherein the leadfingers between two directly adjacent paddle extensions have the maximum leadfinger width greater than the paddle extension width;
    attaching a semiconductor die to the die attach paddle wherein the semiconductor die is larger than the die attach paddle; and
    connecting bond wires between the semiconductor die and the leadfingers and between the semiconductor die and the paddle extensions for providing an electric connection to the die attach paddle.

12. The method as claimed in claim 11 wherein connecting the bond wires between the semiconductor die and the leadfingers is performed by forming a ball bond on the semiconductor die and by forming a wedge bond on the leadfingers.

13. The method as claimed in claim 11 wherein connecting the bond wires between the semiconductor die and the paddle extensions is performed by forming a stand-off stitch bond on the semiconductor die.

14. The method as claimed in claim 11 wherein connecting the bond wires between the semiconductor die and the paddle extensions is performed by forming a security bond on the paddle extensions.

15. The method as claimed in claim 11 wherein connecting the bond wires between the semiconductor die and the paddle extensions is performed by forming a stand-off stitch bond on the paddle extensions.

16. A method of manufacture of a wire-on-lead package system comprising:
providing a die attach paddle with paddle extensions having a paddle extension width and extending out from the die attach paddle and distributed along the periphery of the die attach paddle;
providing leadfingers having a maximum leadfinger width and surrounding the die attach paddle and positioned between the paddle extensions wherein the leadfingers between two directly adjacent paddle extensions have the maximum leadfinger width greater than the paddle extension width;
attaching a semiconductor die to the die attach paddle wherein the semiconductor die is larger than the die attach paddle;
connecting bond wires between the semiconductor die and the leadfingers and between the semiconductor die and the paddle extensions for providing an electric connection to the die attach paddle; and
encapsulating portions of the semiconductor die, the leadfingers, the paddle extensions, and the bond wires using an encapsulant.

17. The method as claimed in claim 16 wherein attaching the semiconductor die includes attaching the semiconductor die over a portion of the leadfingers and a portion of the paddle extensions.

18. The method as claimed in claim 16 wherein attaching the semiconductor die to the die attach paddle is performed using an adhesive and further comprising an electrical interconnect placed between the semiconductor die and the die attach paddle.

19. The method as claimed in claim 16 further comprising providing short leadfingers shorter than the leadfingers and connecting bond wires between the semiconductor die and the short leadfingers.

20. The method as claimed in claim 16 wherein connecting the bond wires between the semiconductor die and the leadfingers, and connecting bond wires between the semiconductor die and the paddle extensions, is performed using a conformal wire-bond support with feature protrusions.

* * * * *

UNITED STATES PATENT AND TRADEMARK OFFICE
CERTIFICATE OF CORRECTION

PATENT NO.         : 8,362,601 B2
APPLICATION NO.    : 12/328764
DATED              : January 29, 2013
INVENTOR(S)        : Camacho et al.

Page 1 of 1

It is certified that error appears in the above-identified patent and that said Letters Patent is hereby corrected as shown below:

In the Specification:

Column 6, line 18, delete "Stitch-Switch Bond" and insert therefor --Stitch Bond--

In the Claims:

Column 10, claim 11, second to last line of the claim, delete "electric connection" and insert therefor --electrical connection--

Column 11, claim 16, line 22, delete "electric connection" and insert therefor --electrical connection--

Signed and Sealed this
First Day of December, 2015

Michelle K. Lee
*Director of the United States Patent and Trademark Office*